(12) United States Patent
Banowetz et al.

(10) Patent No.: US 9,413,313 B2
(45) Date of Patent: Aug. 9, 2016

(54) MULTIMODE POWER AMPLIFIER BIAS CIRCUIT WITH SELECTABLE BANDWIDTH

(71) Applicant: SKYWORKS SOLUTIONS, INC., Woburn, MA (US)

(72) Inventors: Matthew Lee Banowetz, Marion, IA (US); Ramanan Bairavasubramanian, Hiawatha, IA (US); Michael Lynn Gerard, Cedar Rapids, IA (US); Philip H. Thompson, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 38 days.

(21) Appl. No.: 14/481,561

(22) Filed: Sep. 9, 2014

(65) Prior Publication Data

US 2015/0133186 A1    May 14, 2015

Related U.S. Application Data

(60) Provisional application No. 61/875,586, filed on Sep. 9, 2013.

(51) Int. Cl.
| | |
|---|---|
| *H04M 1/00* | (2006.01) |
| *H03F 3/24* | (2006.01) |
| *H03F 3/19* | (2006.01) |
| *H03F 1/56* | (2006.01) |
| *H03F 3/68* | (2006.01) |

(52) U.S. Cl.
CPC .................. *H03F 3/245* (2013.01); *H03F 1/56* (2013.01); *H03F 3/19* (2013.01); *H03F 3/68* (2013.01); *H03F 2200/222* (2013.01); *H03F 2200/27* (2013.01); *H03F 2200/387* (2013.01); *H03F 2200/414* (2013.01); *H03F 2200/451* (2013.01); *H03F 2200/555* (2013.01)

(58) Field of Classification Search
CPC ............. H03F 3/245; H03F 3/19; H03F 1/56; H03F 3/68; H03F 2200/222; H03F 2200/27; H03F 2200/387; H03F 2200/414; H03F 2200/451; H03F 2200/555
USPC ........................................ 445/552; 455/552.1
See application file for complete search history.

(56) References Cited

U.S. PATENT DOCUMENTS

| | | | |
|---|---|---|---|
| 2005/0083130 A1* | 4/2005 | Grilo | 330/288 |
| 2009/0091393 A1* | 4/2009 | Quan et al. | 330/288 |
| 2010/0066436 A1* | 3/2010 | Lee | 327/534 |

\* cited by examiner

*Primary Examiner* — Nader Bolourchi
(74) *Attorney, Agent, or Firm* — Chang & Hale LLP (57) ABSTRACT

Multimode power amplifier bias circuit with selectable bandwidth. In some embodiments, a bias circuit for a power amplifier can include a first bipolar junction transistor (BJT) configured to pass a reference current. The first BJT can be coupled with a second BJT that performs at least some amplification for the power amplifier. The first and second BJTs can be configured as a current mirror. The bias circuit can further include a coupling circuit that couples the collector and the base of the first BJT. The coupling circuit can include a switchable element to allow the coupling circuit to be in a first state or a second state. The first state can be configured to yield a first bandwidth for the bias circuit, and the second state can be configured to yield a second bandwidth for the bias circuit.

19 Claims, 8 Drawing Sheets

MULTIMODE POWER AMPLIFIER BIAS CIRCUIT WITH SELECTABLE BANDWIDTH

CROSS-REFERENCE TO RELATED APPLICATION(S)

This application claims priority to U.S. Provisional Application No. 61/875,586 filed Sep. 9, 2013, entitled MULTIMODE POWER AMPLIFIER BIAS CIRCUIT WITH SELECTABLE BANDWIDTH, the disclosure of which is hereby expressly incorporated by reference herein in its entirety.

BACKGROUND

1. Field

The present disclosure generally relates to radio-frequency (RF) amplifiers, and more particularly, to bias circuits with selectable bandwidth.

2. Description of the Related Art

In some radio-frequency (RF) applications, wireless devices such as smart phones are configured to operate in multiple modes. Accordingly, multi-mode power amplifiers (PAs) for such wireless devices typically need to support a wide variety of frequency bands and/or signal modulation formats.

SUMMARY

According to a number of implementations, the present disclosure relates to a bias circuit for a power amplifier. The bias circuit includes a first bipolar junction transistor (BJT) configured to pass a reference current. The first BJT is coupled with a second BJT that performs at least some amplification for the power amplifier. The first and second BJTs are configured as a current mirror, with each of the first and second BJTs having a collector, a base, and an emitter. The bias circuit further includes a coupling circuit that couples the collector and the base of the first BJT. The coupling circuit includes a switchable element to allow the coupling circuit to be in a first state or a second state, with the first state configured to yield a first bandwidth for the bias circuit, and the second state configured to yield a second bandwidth for the bias circuit.

In some embodiments, each of the first and second BJTs can be a heterojunction bipolar transistor (HBT). The first and second HBTs can be parts of a same die.

In some embodiments, the coupling of the first and second HBTs can include a coupling between the base of the first HBT and the base of the second HBT. The coupling between the base of the first HBT and the base of the second HBT can include a first resistance connected in series with a second resistance. The bias circuit can further include a buffer field-effect transistor (FET), the buffer FET having a source, a drain, and a gate. The source and the drain of the buffer FET can couple a node between the first resistance and the second resistance with a supply voltage VCC node. The gate of the buffer FET can be coupled to the collector of the first HBT.

In some embodiments, the coupling circuit can include a switchable element. The switchable element can include a switchable resistance such that when in the first state, a resistance associated with the switchable resistance is part of the coupling circuit, and when in the second state, the resistance associated with the switchable resistance is bypassed. The switchable resistance can include the resistance connected in parallel with a switch. The switch can include a field-effect transistor (FET).

In some embodiments, the switch being in the first state can result in the bias circuit being in a low bandwidth mode. The low bandwidth mode can include a Wideband Code Division Multiple Access (WCDMA) mode. The switch being in the second state can result in the bias circuit being in a high bandwidth mode. The high bandwidth mode can include a Long Term Evolution (LTE) mode.

In some embodiments, one of the first and second bandwidths can correspond to a bandwidth associated with the WCDMA or LTE mode of operation. The other bandwidth can correspond to the other bandwidth associated with the WCDMA or LTE mode of operation.

In some implementations, the present disclosure relates to a method for operating a bias circuit for a power amplifier. The method includes passing a reference current through a reference bipolar junction transistor (BJT) having a collector, a base, and an emitter. The method further includes generating a bias current for an amplifying BJT as a mirror of the reference current. The method further includes performing a switching operation between the collector and the base of the reference BJT to transition between a first state and a second state of the bias circuit. The first state corresponds to a first bandwidth for the bias circuit, and the second state corresponds to a second bandwidth for the bias circuit.

In a number of implementations, the present disclosure relates to a power amplifier die that includes a semiconductor substrate and a power amplifier (PA) circuit formed on the semiconductor substrate. The PA circuit includes an amplifying bipolar junction transistor (BJT) having a collector, a base, and an emitter. The power amplifier die further includes a bias circuit formed on the semiconductor substrate. The bias circuit is coupled with the PA circuit. The bias circuit includes a reference BJT having a collector, a base, and an emitter. The coupling of the bias circuit and the PA circuit is configured as a current mirror. The bias circuit further includes a switchable element configured to allow the bias circuit to be in a first state or a second state. The first state is configured to yield a first bandwidth for the bias circuit, and the second state is configured to yield a second bandwidth for the bias circuit.

In some embodiments, each of the amplifying BJT and the reference BJT can be a heterojunction bipolar transistor (HBT). The semiconductor substrate can include a gallium arsenide (GaAs) substrate.

In accordance with a number of teachings, the present disclosure relates to a method for fabricating a power amplifier die. The method includes providing a semiconductor substrate. The method further includes forming a power amplifier (PA) circuit on the semiconductor substrate. The PA circuit includes an amplifying bipolar junction transistor (BJT) having a collector, a base, and an emitter. The method further includes forming a bias circuit on the semiconductor substrate. The bias circuit includes a reference BJT having a collector, a base, and an emitter. The bias circuit further includes a switchable element configured to allow the bias circuit to be in a first state or a second state, with the first state configured to yield a first bandwidth for the bias circuit, and the second state configured to yield a second bandwidth for the bias circuit. The method further includes forming a current mirror coupling between the bias circuit and the PA circuit.

According to a number of implementations, the present disclosure relates to a power amplifier module that includes a packaging substrate configured to receive a plurality of components. The module further includes a power amplifier (PA) circuit formed on a die that is mounted on the packaging substrate. The PA circuit includes an amplifying bipolar junction transistor (BJT) having a collector, a base, and an emitter.

The module further includes a bias circuit formed on the die. The bias circuit is coupled with the PA circuit. The bias circuit includes a reference BJT having a collector, a base, and an emitter. The coupling of the bias circuit and the PA circuit is configured as a current mirror. The bias circuit further includes a switchable element configured to allow the bias circuit to be in a first state or a second state, with the first state configured to yield a first bandwidth for the bias circuit, and the second state configured to yield a second bandwidth for the bias circuit. The module further includes a plurality of connectors configured to provide electrical connections between the PA circuit, the bias circuit, and the packaging substrate.

In some implementations, the present disclosure relates to a wireless device that includes a transceiver configured to process RF signals. The wireless device further includes an antenna in communication with the transceiver. The antenna is configured to facilitate transmission of an amplified RF signal. The wireless device further includes a power amplifier (PA) module in communication with the transceiver. The PA module is configured to generate the amplified RF signal. The PA module includes a PA circuit. The PA circuit includes an amplifying bipolar junction transistor (BJT) having a collector, a base, and an emitter. The PA module further includes a bias circuit. The bias circuit is coupled with the PA circuit. The bias circuit includes a reference BJT having a collector, a base, and an emitter. The coupling of the bias circuit and the PA circuit is configured as a current mirror. The bias circuit further includes a switchable element configured to allow the bias circuit to be in a first state or a second state, with the first state configured to yield a first bandwidth for the bias circuit, and the second state configured to yield a second bandwidth for the bias circuit.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Many wireless devices such as smart phones are configured to operate in multiple modes. Accordingly, multi-mode power amplifiers (PAs) for such wireless devices typically need to support a wide variety of frequency bands and/or signal modulation formats. For example, in a typical hybrid PA architecture, a given amplifier chain is used to boost both WCDMA (third generation (3G)) and LTE (fourth generation (4G)) signals. While output power, frequency, and gain requirements might be similar, demands on bias circuitry for such an amplifier chain can be quite different.

By way of examples, for WCDMA operation, stringent noise requirements at frequency offsets as close as 45 MHz from a carrier frequency can be imposed to prevent degrading the sensitivity of a receiver. Accordingly, bias bandwidth can be set at around 20 MHz or lower to minimize or reduce bias noise contribution to the overall PA noise.

For LTE operation, bias bandwidth needs to be wide enough to support, for example, 20 MHz/100 resource block (RB) signals without generating memory effects which degrade adjacent channel power. Accordingly, bias bandwidth that is wider than 60 MHz is typically needed.

In some conventional bias circuit designs, an emitter follower can be used with its base biased 2 VBE above ground to provide a corresponding base current into the power amplifier. Such a circuit can provide both low noise and consistent output impedance for the widest LTE modulation bandwidth. However, a drawback of such a circuit is that the circuit requires significant voltage headroom for proper operation. In the context of a gallium arsenide (GaAs) heterojunction bipolar transistor (HBT) power amplifier design, a minimum supply voltage typically needs to be approximately 3.0V or greater for this circuit to be effective. However, such a voltage is typically higher than the minimum battery voltages specified in many wireless handset designs.

In some conventional bias circuit designs, a current mirror bias circuit with field-effect transistor (FET) buffer is commonly used to extend the battery voltage down to, for example, approximately 2.5V. In order to remove the FET's VGS variation due to effects such as temperature, process, and output current, such a current mirror bias circuit is typically used in a feedback circuit. Such a feedback circuit can impose a bandwidth constraint. PA performance parameters such as output impedance (which is related to PA linearity) and noise rejection can conflict with such a constraint in the bias circuit bandwidth.

Disclosed herein are various examples of circuits, devices and methods that can be configured to, among others, address the foregoing challenges associated with PAs and their bias circuits. In some implementations as described herein, a current mirror bias circuit with a FET buffer can be configured to support operation of, for example, an HBT power amplifier at battery voltages below, for example, approximately 3.0V. In the example contexts of WCDMA and LTE, a relatively low bias bandwidth is desired for WCDMA, and a relatively high bias bandwidth is desired for LTE. For such examples, a current mirror bias circuit can be configured to include a feature of selectable bandwidth.

Figure 1:
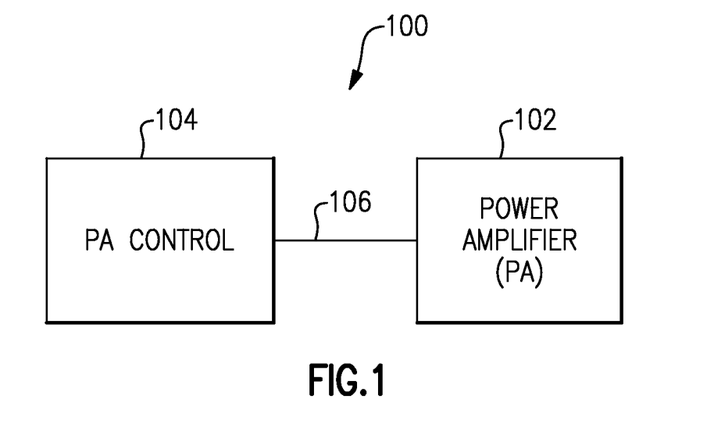
FIG. 1 shows a block diagram of a power amplifier (PA) operating configuration that includes a PA being controlled by a PA control component.
Figure 2:
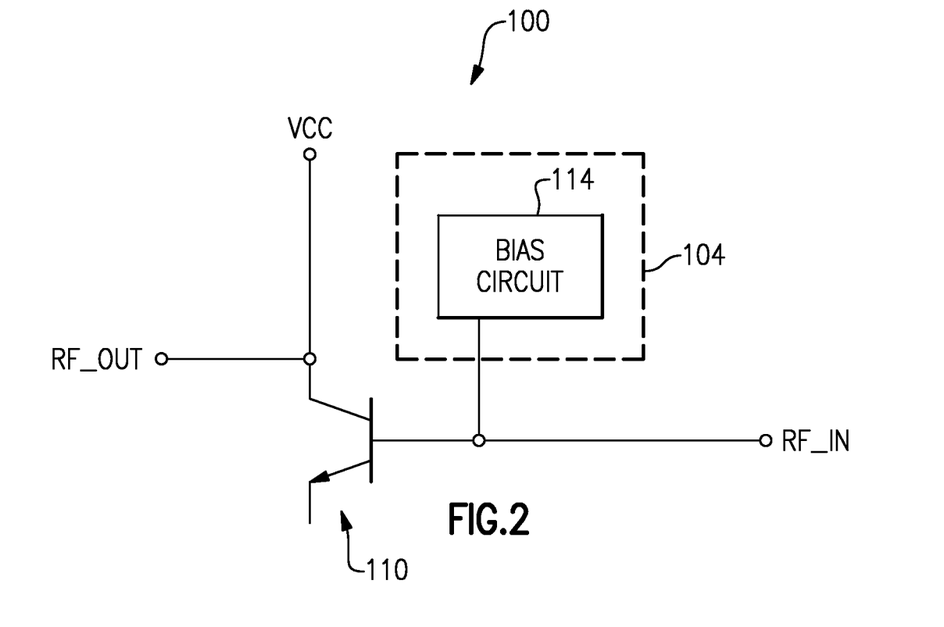
FIG. 2 shows a more specific example of the operating configuration of FIG. 1 in an example context of a heterojunction bipolar transistor (HBT) based PA.

FIG. 1 schematically shows a PA operating configuration 100 that includes a PA 102 being controlled (line 106) by a PA control component 104. FIG. 2 shows a more specific example of such an operating configuration 100 in an example context of an HBT 110 based PA. Although described herein in such a context, it will be understood that one or more features of the present disclosure can also be implemented in PAs based on other types of transistors.

In FIG. 2, a radio-frequency (RF) signal being amplified can be provided to the base of the HBT 110 from an input port (RF_in). Such an input signal can be passed through an input path that can include, for example, a matching network (not shown) and a DC-block capacitance (not shown). The amplified signal can then be output through the collector of the HBT 110, and then through an output port (RF_out). In the example of FIG. 2, supply voltage VCC can be provided to the collector of the HBT 110.

As further shown in FIG. 2, a PA control component 104 can include a bias circuit 114. The bias circuit 114 is shown to be coupled to the base of the HBT 110. Various examples of the bias circuit 114 are described herein in greater detail.

Figure 3:
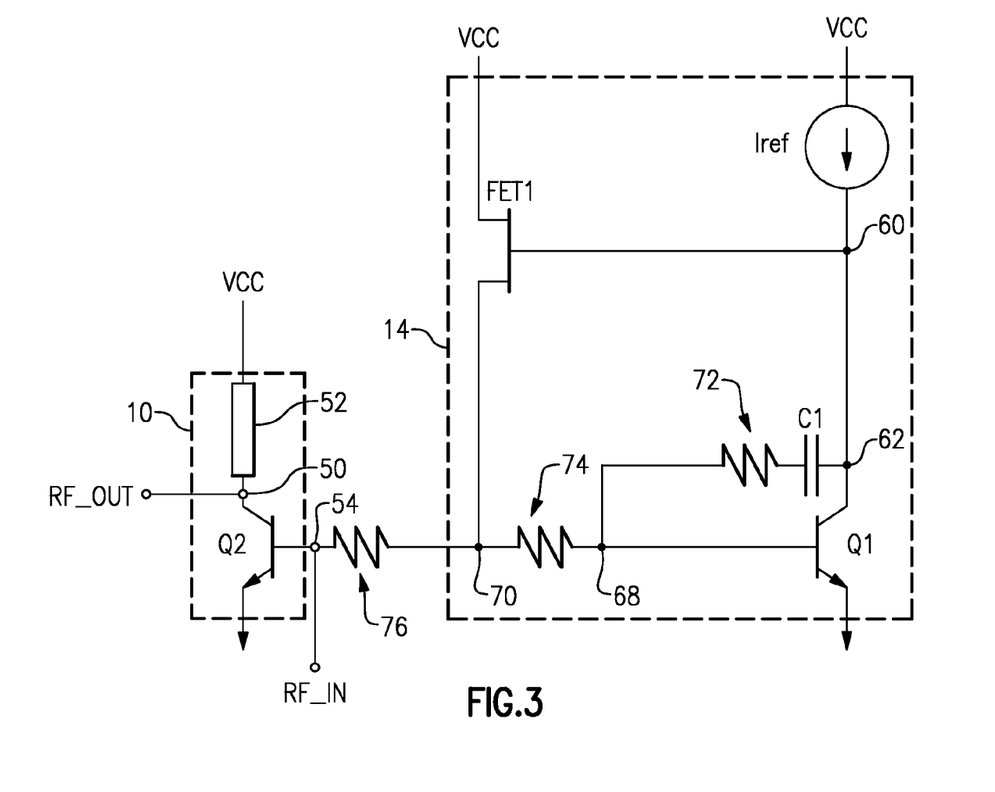
FIG. 3 shows an example of a bias circuit for which one or more features of the present disclosure can be implemented to provide switchable bandwidth selection functionality.

FIG. 3 shows an example of a bias circuit 14 for which one or more features of the present disclosure can be implemented to provide switchable bandwidth selection functionality. The example bias circuit 14 is shown to provide a bias signal to an amplifier circuit 10. In some embodiments, the amplifier circuit 10 can be one of a plurality of amplification stages of an amplifier, including but not limited to a driver stage.

The example amplifier circuit 10 is shown to include a bipolar transistor Q2 such as an HBT having a base, an emitter, and a collector. The emitter can be coupled to, for example, a ground. The base is shown to be coupled to a node 54 which is in communication with an input node (RF_in) for receiving an RF signal to be amplified. The collector is shown to be coupled to a node 50 which is in communication with an output node (RF_out) for outputting the amplified RF signal.

In the example of FIG. 3, supply voltage VCC is shown to be provided to the collector of the transistor Q2 through a line element 52. In some embodiments, the line element 52 can be, for example, a choke inductance.

In the example of FIG. 3, the bias circuit 14 is shown to provide a desired bias current to the transistor Q2 by a current mirror configuration between a reference transistor Q1 and the amplifying transistor Q2. In the example mirror configuration, the base of Q1 and the base of Q2 are shown to be coupled through resistances 74 and 76.

On the reference side, a reference current generator is shown to generate Iref from a supply voltage VCC, and Iref is shown to be provided to the collector of the transistor Q1. In some embodiments, both of the transistors Q1 and Q2 can be formed on the same die so as to allow their device properties (e.g., beta values) to be substantially matched. Such matching of the transistors Q1 and Q2 can allow the output current of the mirror (collector current of Q2) to be proportional to the collector current (Iref) of Q1.

In the example shown in FIG. 3, the bandwidth of a feedback loop associated with the current mirror bias circuit 14 can be determined at least in part by a collector-base coupling circuit between the collector (e.g., at node 62) and the base (e.g., at node 68) of Q1. The example collector-base coupling circuit is shown to include a capacitance C1 connected in series with a resistance 72.

In the example shown in FIG. 3, buffer functionality can be provided by a FET (FET1) whose source/drain terminals couple the supply voltage VCC to node 70 between the bases of Q1 and Q2. The gate of FET1 is shown to be coupled to the output of the Iref generator (at node 60).

Figure 4:
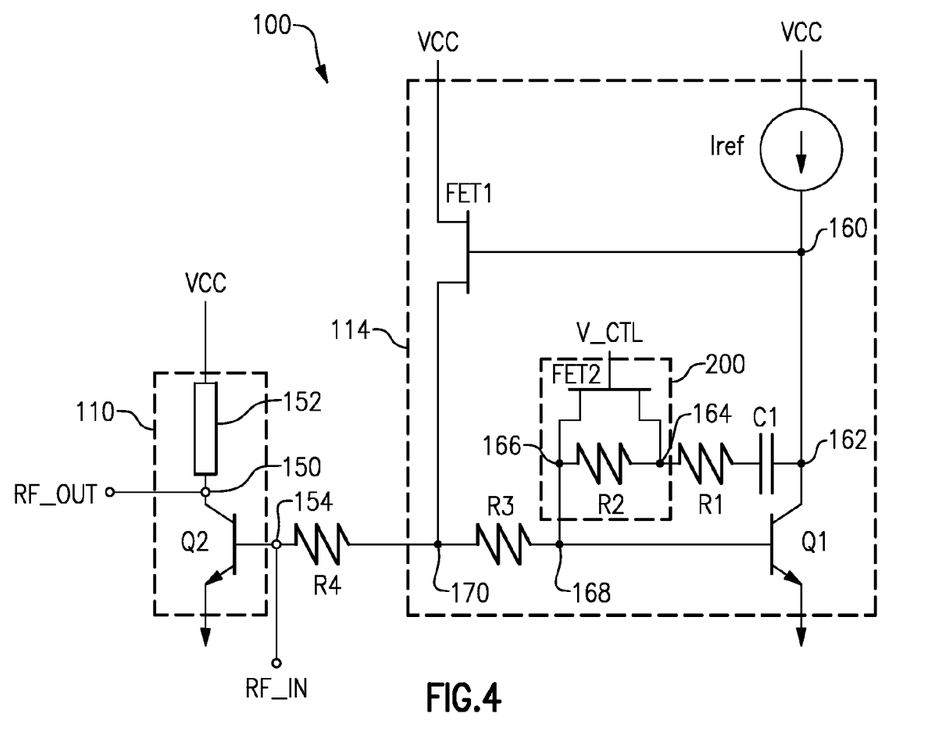
FIG. 4 shows an example of a PA operating configuration where a bias circuit includes a switchable component to allow the bias circuit to operate in a plurality of modes.

FIG. 4 shows an example of a PA operating configuration 100, where a bias circuit 114 includes a switchable component to allow the bias circuit 114 to operate in a plurality of modes. In various examples described herein, such modes can include WCDMA (where a relatively low bias bandwidth is desired) and LTE (where a relatively high bias bandwidth is desired). Although described in the context of such example modes, it will be understood that one or more features of the present disclosure can also be implemented for other modes of operation.

In the example configuration 100 of FIG. 4, an amplifier circuit 110 can be similar to the example amplifier circuit 10 of FIG. 3. More particularly, the amplifier circuit 110 can include a bipolar transistor Q2 such as an HBT having a base, an emitter, and a collector. The emitter can be coupled to a ground. The base is shown to be coupled to a node 154 which is in communication with an input node (RF_in) for receiving an RF signal to be amplified. The collector is shown to be coupled to a node 150 which is in communication with an output node (RF_out) for outputting the amplified RF signal. A supply voltage VCC is shown to be provided to the collector of the transistor Q2 through a line element 152 (e.g., a choke inductance).

In the example configuration 100 of FIG. 4, parts of a bias circuit 114 can be similar to the example of FIG. 3. More particularly, the bias circuit 114 can be configured to provide a desired bias current to the transistor Q2 by a current mirror configuration between a reference transistor Q1 and the amplifying transistor Q2. In the example mirror configuration, the base of Q1 and the base of Q2 are shown to be coupled through resistances R3 and R4.

On the reference side, a reference current generator is shown to generate Iref from a supply voltage VCC, and Iref is shown to be provided to the collector of the transistor Q1. In some embodiments, both of the transistors Q1 and Q2 can be formed on the same die so as to allow their device properties (e.g., beta values) to be substantially matched. Such matching of the transistors Q1 and Q2 can allow the output current of the mirror (collector current of Q2) to be proportional to the collector current (Iref) of Q1.

In the example shown in FIG. 4, buffer functionality can be provided by a FET (FET1) whose source/drain terminals couple the supply voltage VCC to node 170 between the bases of Q1 and Q2. The gate of FET1 is shown to be coupled to the output of the Iref generator (at node 160).

In the example shown in FIG. 4, the bandwidth of a feedback loop associated with the current mirror bias circuit 114 can be determined at least in part by a collector-base coupling circuit between the collector (e.g., at node 162) and the base (e.g., at node 168) of Q1. The example collector-base coupling circuit is shown to include a series connection of a capacitance C1, a resistance R1, and a switchable element 200. For example, the switchable element 200 can include a resistance R2 connected in parallel with a FET (FET2) between nodes 164 and 168, with the node 164 being between R1 and R2.

The switchable element 200 being configured in the foregoing example manner can allow the RC value of the collector-base coupling circuit for Q1 to change between two values. Such a change can be implemented by switching FET2 between OFF and ON states with a control signal V_CTL applied to its gate. When FET2 is in the ON state, R2 can be bypassed, so that the RC value is approximately R1×C1. When FET2 is in the OFF state, the RC value is approximately (R1−FR2)×C1. In the example context of WCDMA and LTE operations, FET2 can be turned ON to yield an LTE or high bandwidth mode; and FET2 can be turned OFF to yield a WCDMA or low bandwidth mode.

Figure 5:
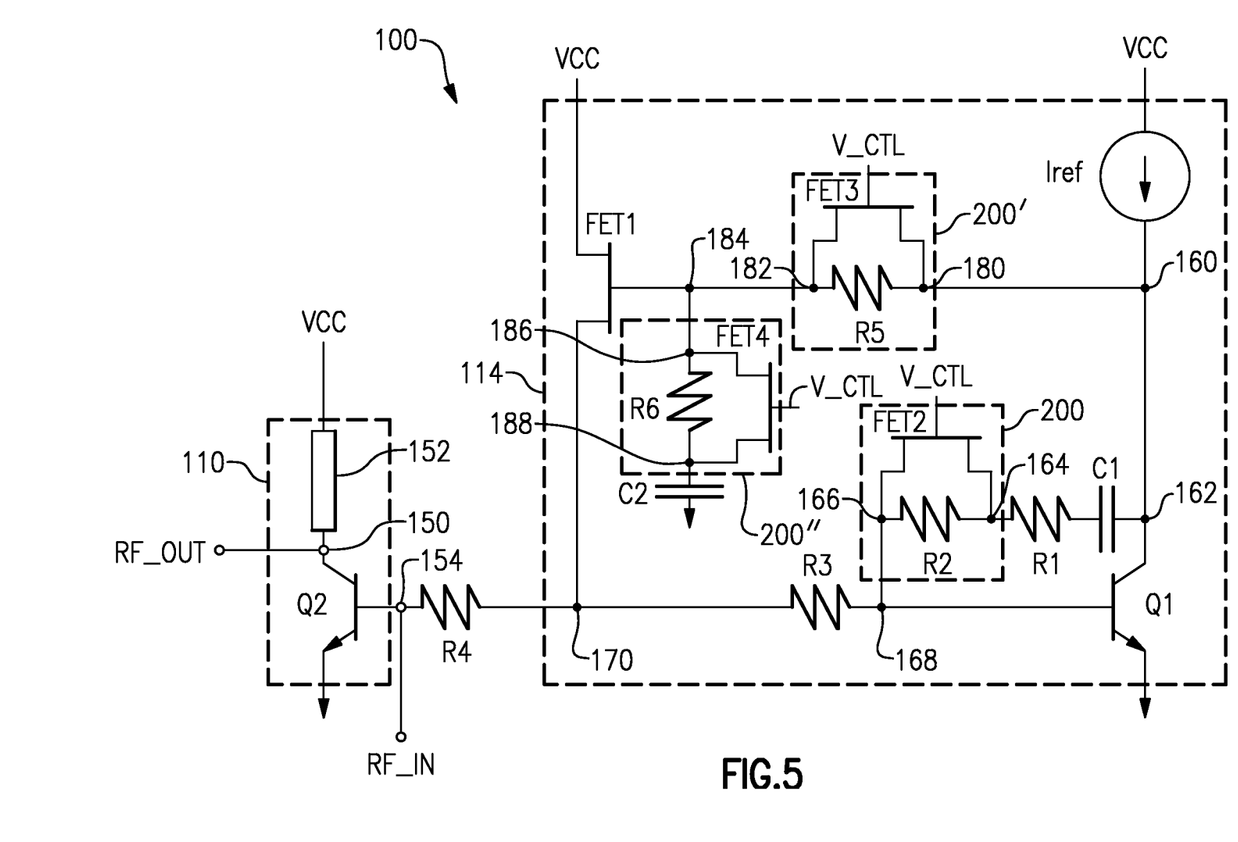
FIG. 5 shows that in some embodiments, one or more switchable elements can be implemented at one or more other parts of the example bias circuit of FIG. 4.

FIG. 5 shows that in some embodiments, one or more switchable elements can be implemented at other parts of a bias circuit. For the purpose of description of an example configuration 100 of FIG. 5, it will be assumed that an amplifier circuit 110 and its coupling to node 170 can be similar to the example of FIG. 4. Similarly, coupling of a buffer FET (FET1) between VCC and node 170, coupling of Iref (with VCC input) and Q1, and collector-base coupling (that includes a switchable element 200) for Q1, can be similar to the examples described in reference to FIG. 4.

In the example configuration 100 of FIG. 5, two additional switchable elements 200', 200" are shown to be implemented. The switchable element 200' is shown to be implemented between the gate of FET1 and node 160 which is between the Iref generator and the collector of Q1. The switchable element 200' is shown to include a resistance R5 connected in parallel with a FET (FET3) between nodes 180 (connected to node 160) and 182 (connected to the gate of FET1). FET3 is shown to be provided with a control signal V_CTL to thereby allow it to be in an ON or an OFF state, so as to allow insertion (FET3 OFF) or removal (FET3 ON) of resistance R5 between the gate of FET1 and node 160.

The switchable element 200" is shown to be implemented between the gate of FET1 and signal ground. The switchable element 200" is shown to include a resistance R6 connected in parallel with a FET (FET4) between node 186 (connected to node 184 and the gate of FET1) and 188 (connected to the signal ground through a capacitance C2). FET4 is shown to be provided with a control signal V_CTL to thereby allow it to be in an ON or an OFF state, so as to allow insertion (FET4 OFF) or removal (FET4 ON) of resistance R6 in the RC coupling between the gate of FET1 and the signal ground.

In some embodiments, the example switches FET2, FET3, FET4 can be controlled by a common V_CTL signal. Such a V_CTL applied to FET2 can allow the current mirror bias circuit 114 to operate in low or high bandwidth mode. By switching the additional example devices FET3, FET4, one or more additional changes in the bandwidth of the bias feedback loop. For example, in the low bandwidth mode, the additional switches FET3, FET4 and their respective switched components R5, R6 can be configured to insert one or more poles in the feedback loop to, for example, further attenuate noise at a selected frequency while still substantially maintaining the desired bandwidth of the bias circuit 114.

In the various examples of switchable elements in FIGS. 4 and 5, a resistance is described as being in parallel with a FET. It will be understood that other configurations can also be implemented utilizing different switches, different circuit elements, and/or different arrangements of such switches and circuit elements.

Figure 6A:
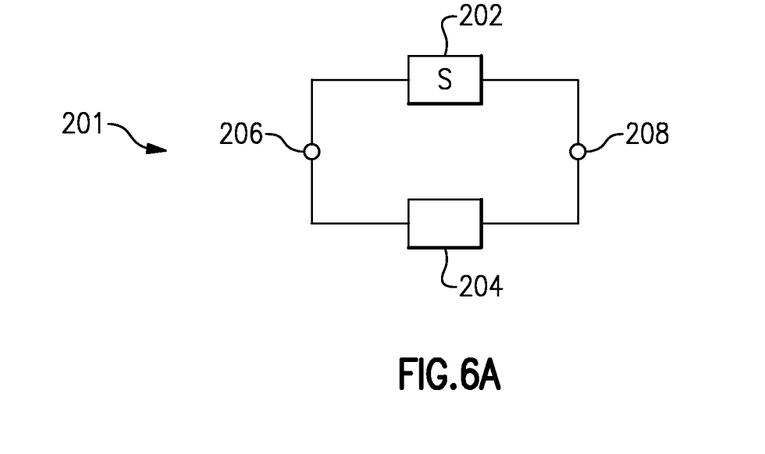
FIGS. 6A-6C show some non-limiting examples of how one or more circuit elements can be arranged with one or more switches to facilitate operation of the one or more switchable elements of FIGS. 4 and 5.
Figure 6B:
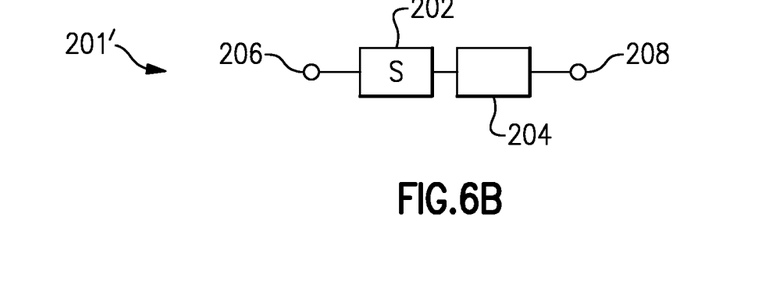
Figure 6C:
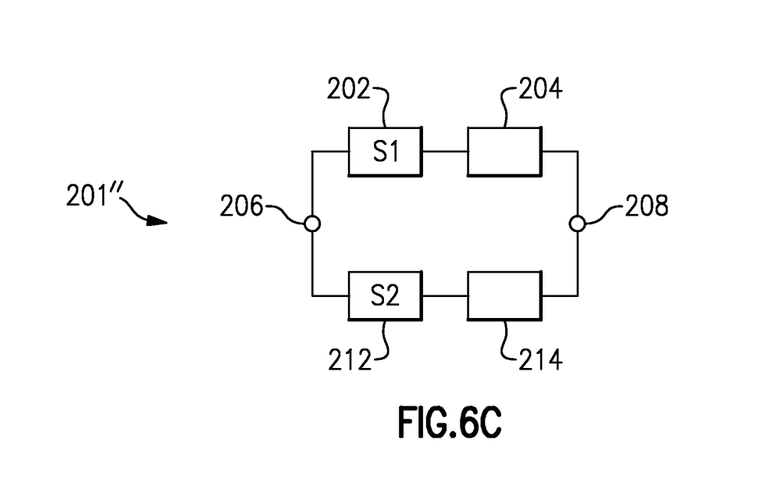

FIGS. 6A-6C show some non-limiting examples of how one or more circuit elements 204, 214 (e.g., resistance, capacitance, inductance, etc.) can be arranged with one or more switches 202, 212. For example, FIG. 6A shows a configuration 201 having a switch S (202) in parallel with a circuit element 204, between nodes 206, 208. Such a configuration can be similar to the examples described in reference to FIGS. 4 and 5, where the switch S is a FET, and the circuit element is a resistance.

In another example, FIG. 6B shows a configuration 201' having a switch S (202) in series with a circuit element 204, between nodes 206, 208. In yet another example, FIG. 6C shows a configuration 201" having two in-series circuits (S1 (202) in series with a circuit element 204, and S2 (212) in series with a circuit element 214) connected in parallel between nodes 206, 208. Other configurations of circuit element(s) and switch(es) can also be implemented.

Figure 7:
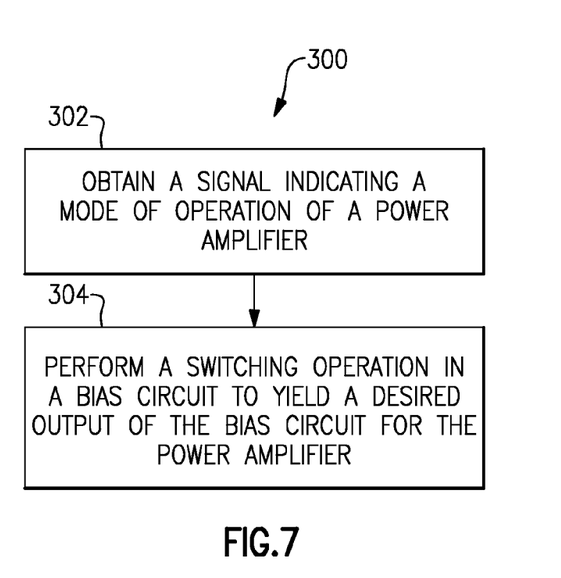
FIG. 7 shows a process that can be implemented to control a bias circuit having one or more features as described herein.

FIG. 7 shows a process 300 that can be implemented to control a bias circuit having one or more features as described herein. In block 302, a signal indicating a mode of operation of a power amplifier can be obtained. In block 304, a switching operation can be performed in the bias circuit to yield a desired output of the bias circuit for the power amplifier.

Figure 8:
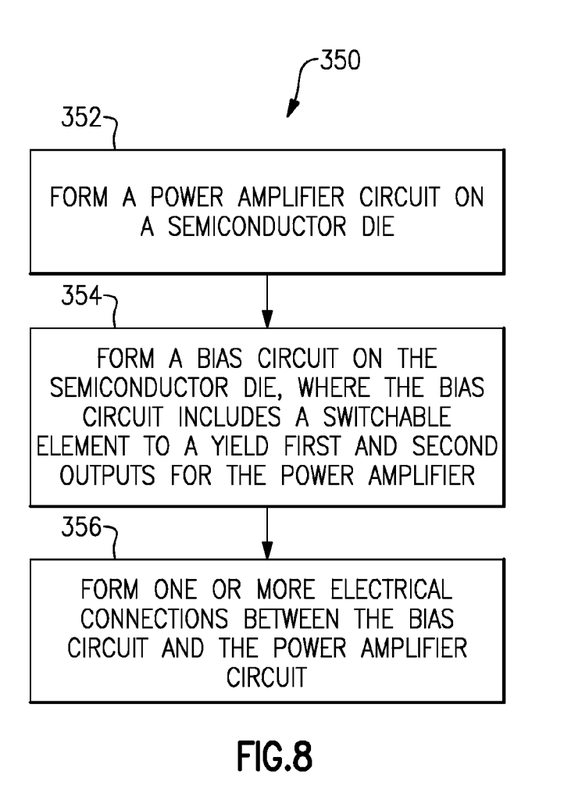
FIG. 8 shows a process that can be implemented to fabricate a bias circuit having one or more features as described herein.

FIG. 8 shows a process 350 that can be implemented to fabricate a bias circuit having one or more features as described herein. In block 352, a power amplifier circuit can be formed on a semiconductor die. In block 354, a bias circuit can be formed on the same semiconductor die. The bias circuit can include a switchable element to allow switching between first and second modes of the bias circuit for the power amplifier circuit. In block 356, one or more electrical connections can be formed between the bias circuit and the power amplifier circuit.

Figure 9:
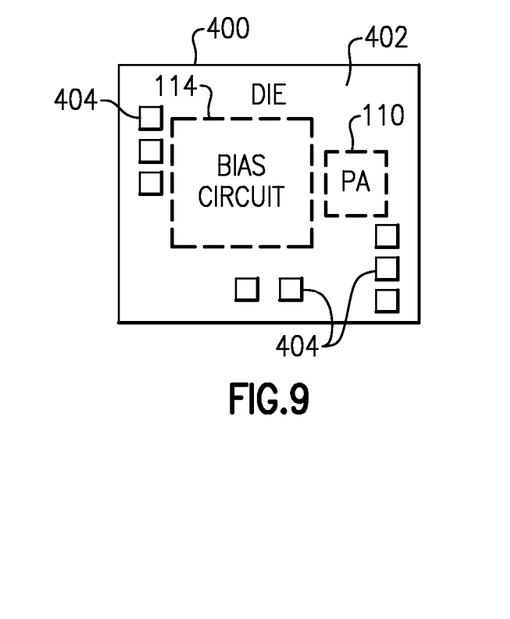
FIG. 9 depicts a die that can be fabricated according to the example process of FIG. 8.

FIG. 9 schematically depicts a die 400 that can be fabricated according to the example process 350 of FIG. 8. The semiconductor die 400 can include a substrate 402, and a power amplifier (PA) circuit 110 (e.g., HBT) can be formed on the substrate 402. A bias circuit 114 can also be formed on the substrate 402. For example, and in the context of an HBT PA, at least an HBT of the bias circuit for a current mirror can be formed on the same substrate 402. A plurality of connection pads 404 can also be formed on the substrate 402 to provide, for example, power and signals for the PA circuit 102 and the bias circuit 114.

Figure 10:
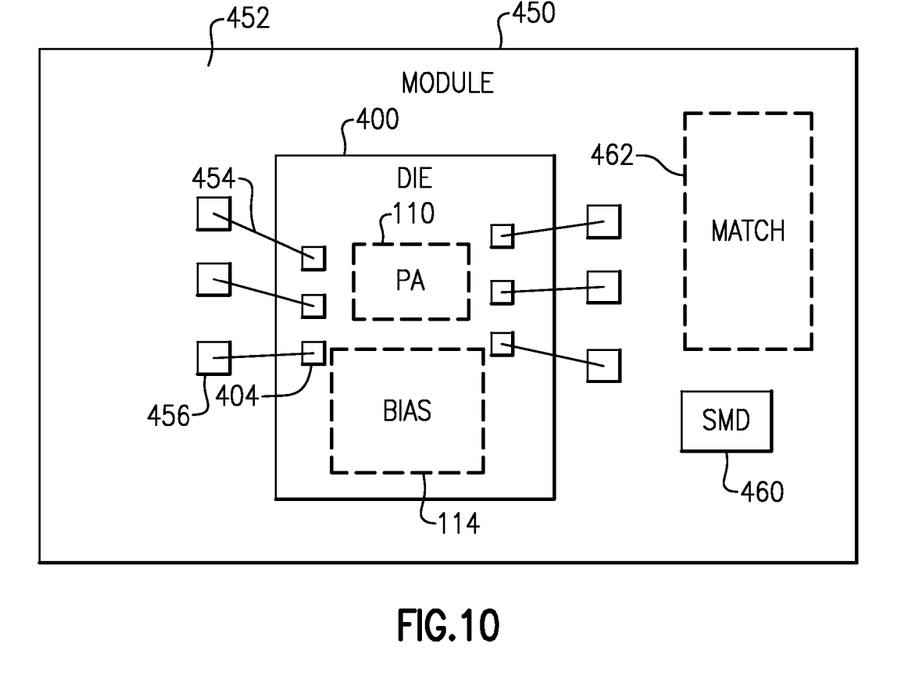
FIG. 10 depicts an example module having one or more featured as described herein.

In some implementations, one or more features described herein can be included in a module. FIG. 10 schematically depicts an example module 450 having a packaging substrate 452 that is configured to receive a plurality of components. In some embodiments, such components can include a die 400 having one or more featured as described herein. For example, the die 400 can include a PA circuit 102 and a bias circuit 114. A plurality of connection pads 404 can facilitate electrical connections such as wirebonds 454 to connection pads 456 on the substrate 452 to facilitate passing of various power and signals to and from the die 400.

In some embodiments, other components can be mounted on or formed on the packaging substrate 452. For example, one or more surface mount devices (SMDs) (460) and one or more matching networks (462) can be implemented. In some embodiments, the packaging substrate 452 can include a laminate substrate.

In some embodiments, the module 450 can also include one or more packaging structures to, for example, provide protection and facilitate easier handling of the module 450. Such a packaging structure can include an overmold formed over the packaging substrate 452 and dimensioned to substantially encapsulate the various circuits and components thereon.

It will be understood that although the module 450 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a handheld wireless device with or without phone functionality, a wireless tablet, a wireless router, a wireless access point, a wireless base station, etc.

Figure 11:
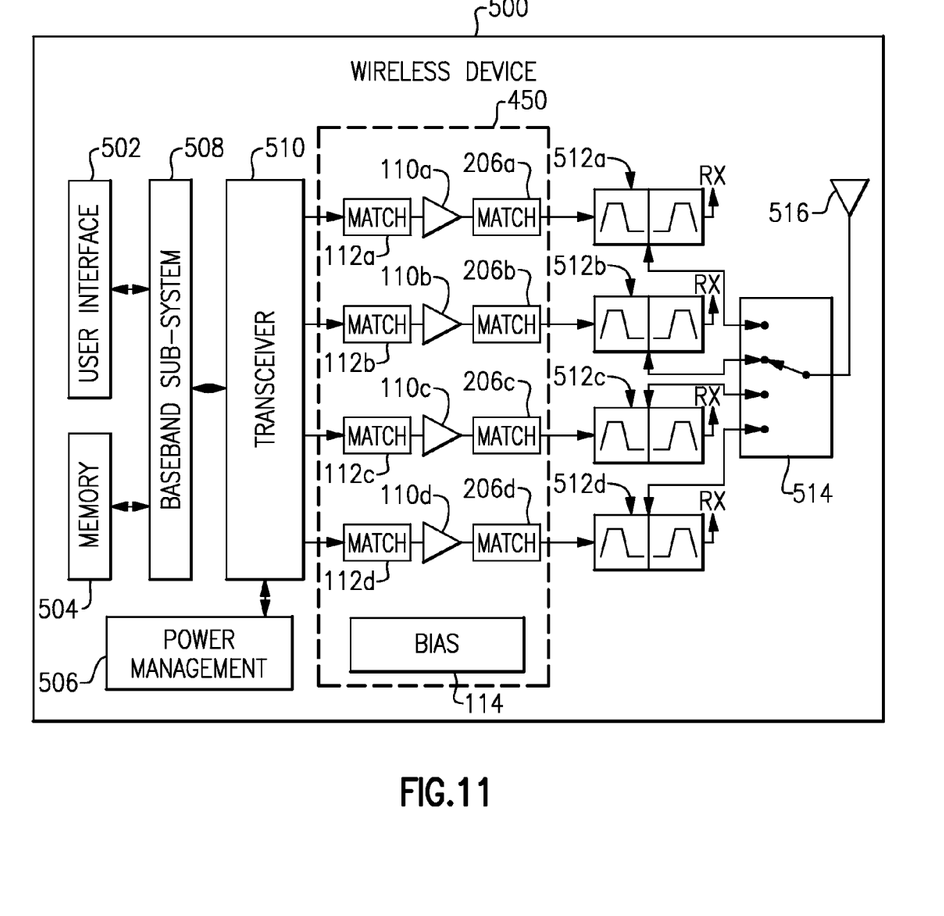
FIG. 11 depicts an example wireless device having one or more advantageous features described herein.

FIG. 11 schematically depicts an example wireless device 500 having one or more advantageous features described herein. One or more PAs 110 as described herein are shown to be biased by one or more bias circuit 114 having one or more features as described herein. In embodiments where the PAs 110 and their bias circuit(s) 114 are packaged into a module, such a module can be represented by a dashed box 450. In some embodiments, the module 450 can include at least some of input and output matching circuits 112, 206.

The PAs 110 can receive their respective RF signals from a transceiver 510 that can be configured and operated in known manners to generate RF signals to be amplified and transmitted, and to process received signals. The transceiver 510 is shown to interact with a baseband sub-system 508 that is configured to provide conversion between data and/or voice signals suitable for a user and RF signals suitable for the transceiver 510. The transceiver 510 is also shown to be connected to a power management component 506 that is configured to manage power for the operation of the wireless device 500. Such power management can also control operations of the baseband sub-system 508 and the module 450.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example wireless device 500, outputs of the PAs 110 are shown to be matched and routed to an antenna 516 via their respective duplexers 512a-512d and a band-selection switch 514. The band-selection switch 514 can be configured to allow selection of, for example, an operating band or an operating mode. In some embodiments, each duplexer 512 can allow transmit and receive operations to be performed simultaneously using a common antenna (e.g., 516). In FIG. 11, received signals are shown to be routed to "Rx" paths (not shown) that can include, for example, a low-noise amplifier (LNA).

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A bias circuit for a power amplifier, the bias circuit comprising:
a first bipolar junction transistor (BJT) configured to pass a reference current, the first BJT coupled with a second BJT that performs at least some amplification for the power amplifier, the first and second BJTs configured as a current mirror, each of the first and second BJTs having a collector, a base, and an emitter; and
a coupling circuit that couples the collector and the base of the first BJT, the coupling circuit including a switchable element to allow the coupling circuit to be in a first state or a second state, the first state configured to yield a first bandwidth for the bias circuit, the second state configured to yield a second bandwidth for the bias circuit.

2. The circuit of claim 1 wherein each of the first and second BJTs is a heterojunction bipolar transistor (HBT).

3. The circuit of claim 2 wherein the first and second HBTs are parts of a same die.

4. The circuit of claim 2 wherein the coupling of the first and second HBTs includes a coupling between the base of the first HBT and the base of the second HBT.

5. The circuit of claim 4 wherein the coupling between the base of the first HBT and the base of the second HBT includes a first resistance connected in series with a second resistance.

6. The circuit of claim 5 further comprising a buffer field-effect transistor (FET), the buffer FET having a source, a drain, and a gate.

7. The circuit of claim 6 wherein the source and the drain of the buffer FET couple a node between the first resistance and the second resistance with a supply voltage VCC node.

8. The circuit of claim 7 wherein the gate of the buffer FET is coupled to the collector of the first HBT.

9. The circuit of claim 2 wherein the switchable element includes a switchable resistance circuit configured to provide a resistor as part of the coupling circuit when in the first state, and to bypass the resistor when in the second state.

10. The circuit of claim 9 wherein the switchable resistance circuit includes the resistor connected in parallel with a switch.

11. The circuit of claim 10 wherein the switch includes a field-effect transistor (FET).

12. The circuit of claim 10 wherein the switch being in the first state results in the bias circuit being in a low bandwidth mode.

13. The circuit of claim 12 wherein the low bandwidth mode includes a Wideband Code Division Multiple Access (WCDMA) mode.

14. The circuit of claim 10 wherein the switch being in the second state results in the bias circuit being in a high bandwidth mode.

15. The circuit of claim 14 wherein the high bandwidth mode includes an LTE mode.

16. A power amplifier die comprising:
a semiconductor substrate;
a power amplifier (PA) circuit formed on the semiconductor substrate, the PA circuit including an amplifying bipolar junction transistor (BJT) having a collector, a base, and an emitter; and
a bias circuit formed on the semiconductor substrate, the bias circuit coupled with the PA circuit, the bias circuit including a reference BJT having a collector, a base, and an emitter, the coupling of the bias circuit and the PA circuit configured as a current mirror, the bias circuit further including a switchable element configured to allow the bias circuit to be in a first state or a second state, the first state configured to yield a first bandwidth for the bias circuit, the second state configured to yield a second bandwidth for the bias circuit.

17. The power amplifier die of claim 16 wherein each of the amplifying BJT and the reference BJT is a heterojunction bipolar transistor (HBT).

18. The power amplifier die of claim 17 wherein the semiconductor substrate includes a gallium arsenide (GaAs) substrate.

19. A wireless device comprising:
a transceiver configured to process RF signals;
an antenna in communication with the transceiver, the antenna configured to facilitate transmission of an amplified RF signal; and
a power amplifier (PA) module in communication with the transceiver and configured to generate the amplified RF signal, the PA module including a PA circuit, the PA circuit including an amplifying bipolar junction transistor (BJT) having a collector, a base, and an emitter, the PA module further including a bias circuit, the bias circuit coupled with the PA circuit, the bias circuit including a reference BJT having a collector, a base, and an emitter, the coupling of the bias circuit and the PA circuit configured as a current mirror, the bias circuit further including a switchable element configured to allow the bias circuit to be in a first state or a second state, the first state configured to yield a first bandwidth for the bias circuit, the second state configured to yield a second bandwidth for the bias circuit.

* * * * *